United States Patent [19]
Delpech et al.

[11] Patent Number: 4,875,140
[45] Date of Patent: Oct. 17, 1989

[54] SUPPORT FOR PRINTED CIRCUIT BOARDS

[75] Inventors: Guy Delpech, Ballainvilliers; Gilles Garnier, Fontenay-le-Fleury, both of France

[73] Assignee: U.S. Philips Corporation, New York, N.Y.

[21] Appl. No.: 188,528

[22] Filed: Apr. 12, 1988

[30] Foreign Application Priority Data

May 6, 1987 [FR] France ................................. 8706394

[51] Int. Cl.⁴ .............................................. H05K 1/18
[52] U.S. Cl. .............................. 361/412; 174/138 D; 174/138 G; 361/395; 361/413
[58] Field of Search ................. 361/412, 413, 417, 420, 361/395; 174/138 D, 138 G

[56] References Cited

U.S. PATENT DOCUMENTS

| | | | |
|---|---|---|---|
| 2,560,212 | 7/1951 | Byrd et al. | 174/138 G |
| 3,289,141 | 11/1966 | White | 361/413 X |
| 4,149,220 | 4/1979 | Crall et al. | 361/395 |
| 4,309,856 | 1/1982 | Varnau et al. | 361/412 X |
| 4,417,297 | 11/1983 | Oyama et al. | 174/138 G X |
| 4,444,318 | 4/1984 | Alexander | 361/412 X |
| 4,495,380 | 1/1985 | Ryan et al. | 361/412 X |
| 4,563,725 | 1/1986 | Kirby | 361/412 X |
| 4,595,794 | 6/1986 | Wasserman | 174/138 G |

Primary Examiner—R. R. Kucia

[57] ABSTRACT

Support for printed circuit boards formed by a column (1) comprising at least one base (3) on which a printed circuit board (6) is to be supported, a collar (4) which is inserted in a hole (5) of the plate, a coupling member, a damper (7) being inserted between the base (3) and the circuit plate (6), the compression of the said damper being ensured by the coupling member.

5 Claims, 3 Drawing Sheets

SUPPORT FOR PRINTED CIRCUIT BOARDS

The invention relates to a support for printed circuit boards formed by a column comprising at least one base on which a circuit board or plate is to be supported, a collar which is inserted in a hole of the plate, and a coupling member.

Such a support is known from French Patent Specification 2536237 to which UK application GB 2,130,805 corresponds. Each Patent Specification describes a brace for printed circuit boards and serving to maintain several boards in parallel. The brace comprises an upper base having a collar which is inserted in a hole of a plate, a lower base opposite to the preceding one, a longilinear element bracing the two bases. The lower base is provided with a flexible coupling means formed by an elastic abutment bearing on one of the plates and a hook traversing the plate to fix it on the upper base of another brace.

The brace described in each said Patent Specification has several disadvantages, for example, the linking of several printed circuit plates in a rigid manner. The printed circuits are often subjected to vibrations and shocks, a rigid assembly entails a destruction by breakage of the circuit board. Moreover, the brace described does not permit an electric contact between two circuit plates or even a thermal bond between the plates and the supporting frame.

It is the object of the invention to provide a support for printed circuit boards ensuring an elasticity between the support and the plate. Being less bulky, and easy to assemble, the support permits on the one hand a thermal conduction between the plates and also a connection of two circuits together by another rigid circuit.

The invention is characterized in that between the base and the circuit plate is inserted a damper, the compression of the damper being ensured by a mobile coupling member fixed on the one hand to the edge of the plate and on the other hand to a part of the column. The elasticity of the damper may be adjusted with respect to the frequency of the vibrations and the mechanical mass of each of the circuits to damp the vibrations of the plate consecutively during the passage of critical frequencies. A prestress on the damper is ensured by the coupling member which presses the said damper between the plate and the base.

The damper preferably is a core of a synthetic material and more in particular of silicone the hardness and the dimension of which are calculated to ensure the damping function related to the critical vibration frequencies of the plate.

In a preferred form of the invention the column is provided with two bases opposite to each other and forming a brace for two circuit boards.

In such a construction a coupling member permits by symmetry of prestressing by pinching two dampers opposite to each other while facilitating the assembly of two circuit plates and ensuring a good thermal conduction for cooling the plates.

Particularly, the coupling member is a sheet placed longitudinally to the column and provided at its two extremeties with a clip fixed to the edge of each of the two circuits, the sheet being moreover provided in its centre with a clip enclosing the median part of the column.

The coupling member is a punched resilient steel sheet which is connected to form a clip connecting by pinching on the one hand the two circuit plates, which plates compress the dampers, and on the other hand the supporting column.

In another embodiment the coupling member is a strip provided with two longitudinal slides, which strip is placed perpendicularly to the two plates, the slides enclosing the edge of each of the two plates, the strip being moreover provided at its two extremities with a flexible element, the two flexible elements enclosing by their median part two contiguous columns.

The coupling member of large area is a thermal radiator but may also be a rigid bond of electric connection placed between the respective circuits of the two plates.

The invention will now be described in greater detail with reference to the accompanying drawing, in which FIG. 1 shows a support for two printed circuit boards provided with two bases.

Figure 1:
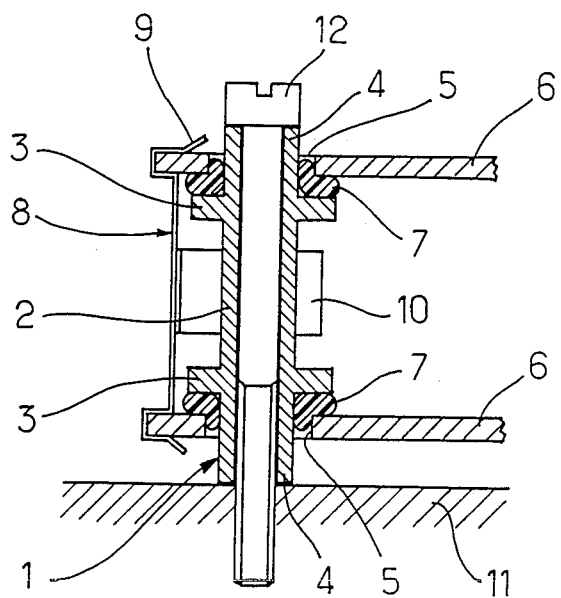

FIG. 1 shows a support for printed circuit boards composed of a column 1 formed by a tube 2 and provided with two cylindrical bases 3 in the form of collars and placed near the two extremities of the tube 2. Each extremity of the tube thus is a collar 4 which is present in centring holes 5 provided in the printed circuit boards 6.

According to the invention, a damper 7 is placed between each board 6 and each base 3 and is centred in a collar 4 and mounted in compression between the base 3 and the circuit board 6. The compression is ensured by a coupling member 8 which flexibly connects on the one hand the printed circuit by a clip 9 which is fixed on the edge of each board 6 and on the other hand a part of the tube 2 of the column 1 by a clip 10.

The assembly of the column 1 with the two printed circuit boards and the coupling member are fixed on a support 11 by a screw 12 which traverses the tube 2, the head of the screw bearing on the top section of the tube.

The damper in this example is a bond of a synthetic material, for example, a silicone, the hardness and the dimensions of which are calculated with respect to the respective mass of each circuit board and to ensure a damping to the vibrations of critical frequencies to which the circuits are subjected and to thus avoid the overvoltage which entails the breaking of the boards.

The column may support only one circuit but in a more practical embodiment the bases 3 are opposite to each other, as the two circuit boards, and this in order to use a coupling member formed by two opposite clips each fixed to the edge of a plate.

Figure 2:
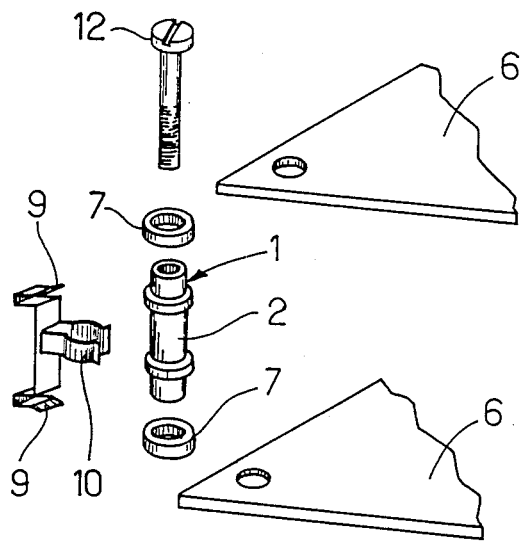
FIG. 2 is an exploded view of the support of FIG. 1.

FIG. 2 is an exploded view of the support of FIG. 1. The coupling member is formed by a rectangular sheet the extremities of which are folded to form a flat pinch or clip 9.

The median part of the sheet comprises a clip 10 substantially in the form of a U which encloses a cylindrical central part of the tube 2 of the column 1. The clip 10 may be punched and folded with the sheet to form one assembly.

Figure 3:
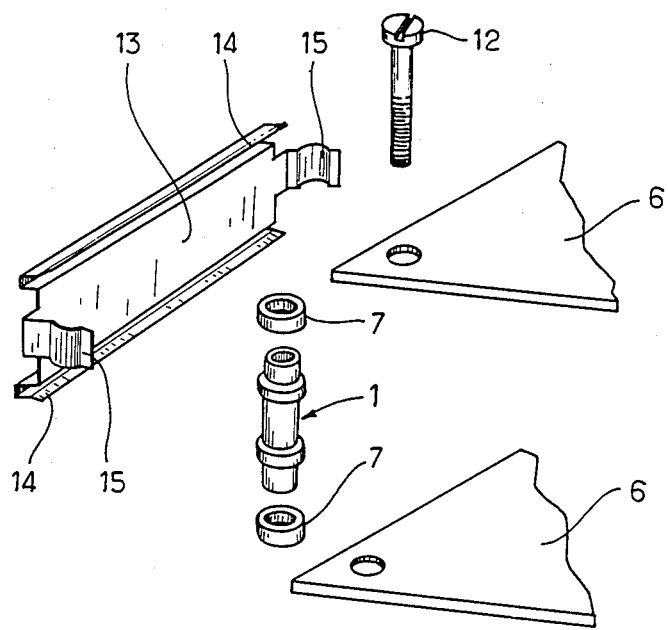
FIG. 3 is an exploded view of the FIG. 1 support provided with a coupling member formed by a punched and folded sheet.

FIG. 3 is an exploded view of the support provided with a coupling member formed from a rectangular strip 13 having substantially the same length as an edge of a board 6, the longitudinal edges of the strip 13 are folded to form a slide 14 which pinches the edge of a board throughout its length.

The lateral edges of the strip are provided with elastic elements, for example, two arms 15 which enclose respectively two columns placed perpendicularly to the plates.

The strip 13 may moreover have the function of pre-compression of the dampers, the function of coolant radiator of the printed circuit boards, or also a function of electric conduction, in which the circuits of the plates may then be connected together.

What is claimed is:

1. A support for printed circuit boards formed by a column comprising at least one base on which a circuit board is to be supported, a collar for insertion in a hole in the circuit board, and a coupling member, wherein a damper can be inserted between said base and said circuit board, the compression of said damper being ensured by said coupling member which includes clip means for clipping said coupling member to said circuit board by engaging both the upper and the lower surface of said board, said coupling member including additional means for engaging part of said column.

2. A support for printed circuit boards as claimed in claim 1, wherein the damper is a core of a synthetic material.

3. A support for printed circuit boards as claimed in either of claims 1 or 2, wherein the column is provided with two bases opposite to each other forming bases for two circuit boards.

4. A support for printed circuit boards as claimed in claim 3, wherein the coupling member is a sheet placed longitudinally to the column and provided at its two extremities with clip means which clips said coupling member to both said circuit boards by engaging both the upper and lower surface of each board, the sheet being moreover provided in its center with a clip enclosing the median part of the column.

5. A support for printed circuit boards as claimed in claim 3, wherein the coupling member is a sheet placed longitudinally to the column and provided at its two extremities with clip means which clips said coupling member to both said circuit boards by engaging both the upper and lower surface of each board, said sheet being moreover provided at each of its two extremities with a flexible element, the two flexible elements enclosing by their median part two contiguous columns.

* * * * *

UNITED STATES PATENT AND TRADEMARK OFFICE
CERTIFICATE OF CORRECTION

PATENT NO. : 4,875,140

DATED : October 17, 1989

INVENTOR(S) : Delpech et al

It is certified that error appears in the above-identified patent and that said Letters Patent is hereby corrected as shown below:

In the title page, under "Filed:" change "Apr. 12, 1988" to --Apr. 29, 1988--.

Signed and Sealed this

Twentieth Day of November, 1990

Attest:

HARRY F. MANBECK, JR.

*Attesting Officer*  *Commissioner of Patents and Trademarks*